US006764919B2

(12) United States Patent
Yu et al.

(10) Patent No.: US 6,764,919 B2
(45) Date of Patent: Jul. 20, 2004

(54) METHOD FOR PROVIDING A DUMMY FEATURE AND STRUCTURE THEREOF

(75) Inventors: Kathleen C. Yu, Austin, TX (US); Edward O. Travis, Austin, TX (US); Bradley P. Smith, Gieres (FR)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/327,498

(22) Filed: Dec. 20, 2002

(65) Prior Publication Data

US 2004/0121577 A1 Jun. 24, 2004

(51) Int. Cl.[7] ....................... H01L 21/76; H01L 21/4763
(52) U.S. Cl. ................... 438/421; 438/400; 438/411; 438/622; 438/631
(58) Field of Search ................... 438/400, 622, 438/422, 411, 421, 619, 631, 778

(56) References Cited

U.S. PATENT DOCUMENTS

| | | | | |
|---|---|---|---|---|
| 5,759,913 A | * | 6/1998 | Fulford et al. | 438/624 |
| 5,773,892 A | * | 6/1998 | Morikawa et al. | 257/758 |
| 5,792,706 A | * | 8/1998 | Michael et al. | 438/626 |
| 6,177,329 B1 | * | 1/2001 | Pang | 438/400 |
| 6,200,900 B1 | * | 3/2001 | Kitch | 438/695 |
| 6,208,015 B1 | * | 3/2001 | Bandyopadhyay et al. | 257/635 |
| 6,214,719 B1 | | 4/2001 | Nag | |
| 6,261,883 B1 | * | 7/2001 | Koubuchi et al. | 438/197 |
| 6,268,277 B1 | * | 7/2001 | Bang | 438/619 |
| 6,287,979 B1 | * | 9/2001 | Zhou et al. | 438/723 |
| 6,297,125 B1 | * | 10/2001 | Nag et al. | 438/421 |
| 6,303,464 B1 | * | 10/2001 | Gaw et al. | 438/422 |
| 6,355,551 B1 | * | 3/2002 | Reinberg | 438/619 |
| 6,368,939 B1 | * | 4/2002 | Sasaki | 438/421 |
| 6,376,330 B1 | * | 4/2002 | Fulford et al. | 438/421 |
| 6,399,476 B2 | * | 6/2002 | Kim et al. | 438/619 |
| 6,423,630 B1 | * | 7/2002 | Catabay et al. | 438/624 |
| 6,492,732 B2 | * | 12/2002 | Lee et al. | 257/758 |
| 6,501,179 B2 | * | 12/2002 | Juengling et al. | 257/758 |
| 6,504,237 B2 | * | 1/2003 | Noguchi et al. | 257/666 |
| 6,524,948 B2 | * | 2/2003 | Tamaoka et al. | 438/637 |
| 6,627,529 B2 | * | 9/2003 | Ireland | 438/619 |

OTHER PUBLICATIONS

Wolf, Stanley et a Silicon Processing For the VLSI Era vol. 2: Process Integration, Lattice Press, 1990, pp. 176–189.*

* cited by examiner

*Primary Examiner*—Michael Lebentritt
(74) *Attorney, Agent, or Firm*—Kim-Marie Vo

(57) ABSTRACT

Dummy features (64, 65a, 65b, 48a, 48b) are formed within an interlevel dielectric layer (36). A non-gap filling dielectric layer (72) is formed over the dummy features (64, 65a, 65b, 48a, 48b) to form voids (74) between dummy features (64, 65a, 65b, 48a, 48b) or between a dummy feature (48a) and a current carrying region (44). The dummy features (64, 65a, 65b, 48a, 48b) can be conductive (48a, 48b) and therefore, formed when forming the current carrying region (44). In another embodiment, the dummy features (64, 65a, 65b, 48a, 48b) are insulating (64, 65a, 65b) and are formed after forming the current carrying region (44). In yet another embodiment, both conductive and insulating dummy features (64, 65a, 65b, 48a, 48b) are formed. In a preferred embodiment, the voids (74) are air gaps, which are a low dielectric constant material.

11 Claims, 7 Drawing Sheets

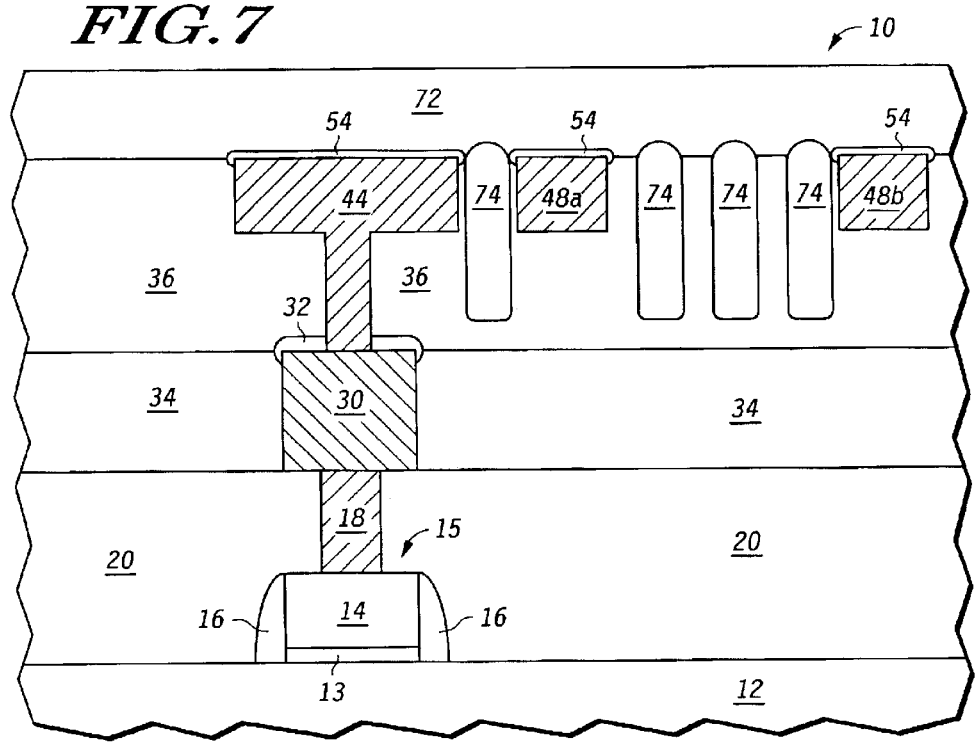
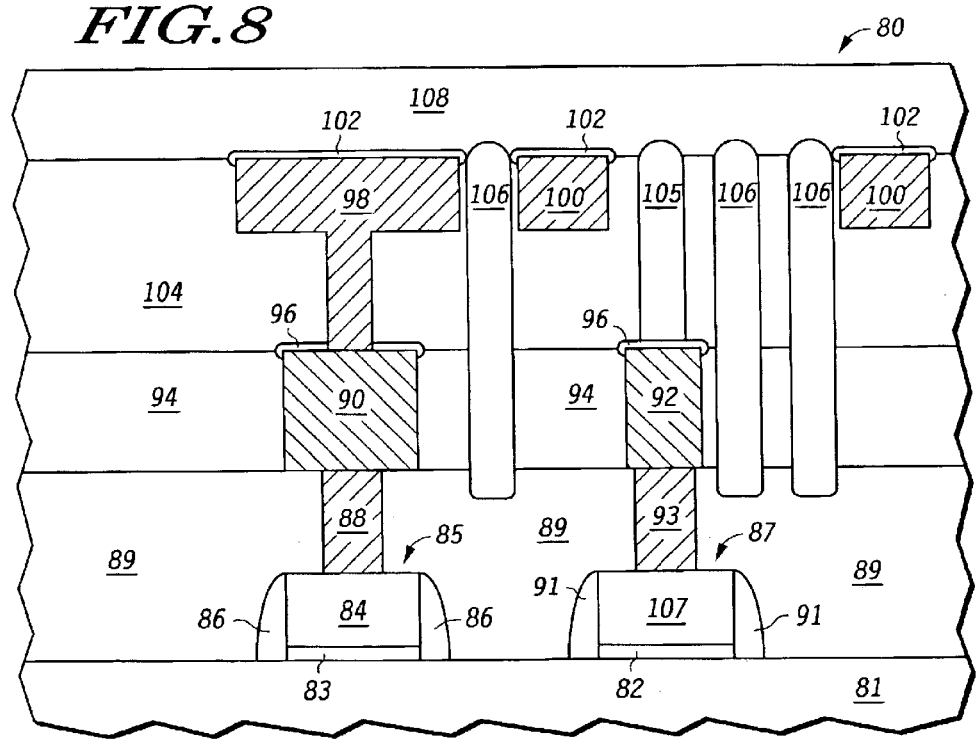

METHOD FOR PROVIDING A DUMMY FEATURE AND STRUCTURE THEREOF

FIELD OF THE INVENTION

This invention relates generally to semiconductor processing, and more specifically, to forming air gaps as a part of a semiconductor device.

BACKGROUND

In order to decrease the capacitance of metal interconnects, silicon dioxide ($SiO_2$) can be replaced by a low dielectric constant (low-k) materials as an interlevel dielectric (ILD) layer. As used herein a low-k material has a dielectric constant less than that of $SiO_2$ (i.e., less than approximately 4.0.) One desirable low-k material is a low-pressure gas or vacuum, which are both commonly termed air or air gaps.

Air gaps can be formed by placing two metal interconnects in close proximity to each other so that when an insulating material is deposited over the surface of a semiconductor wafer, the insulating material will not completely fill the space between the two metal interconnects and hence, an air gap is formed in the space. However, even when an air gap is formed, there exists some capacitance coupling between the two metal interconnects due to their proximity to each other. Since increasing the spacing between the two metal interconnects decreases capacitance coupling more than forming air gaps, design rules often require that the metal interconnects that are sensitive to capacitance coupling are often spaced apart a distance that is too large to form air gaps using conventional processes. However, this undesirably increases the size of the semiconductor device or die. A less desirable low-k material than air (i.e., a material having a higher dielectric constant than air) is deposited between the metal interconnects that are sensitive to capacitance. It would be extremely desirable to further decrease capacitance between the metal lines. Thus, a need exists for a process for using air as a low-k material between metal interconnects that are spaced too far apart to traditionally have air gaps formed there between.

BRIEF DESCRIPTION OF THE DRAWINGS

The present invention is illustrated by way of example and is not limited by the accompanying figures, in which like references indicate similar elements.

FIG. 7 illustrates the semiconductor device of FIG. 6 after forming voids 74 in accordance with one embodiment of the present invention;

FIG. 8 illustrates forming voids in accordance with another embodiment of the present invention;

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As used herein, conductive dummy features are features that are made from conductive material but that do not carry current through them during operation, as compared to a bit line and a gate electrode, which can be made from a conductive material and transmit or carry a current during device operation. In one embodiment, conductive dummy features are not coupled to another conductive feature except perhaps by other conductive dummy features. Voids are closed areas that include a gas (e.g. air) or are a vacuum. Voids are not limited to being spherical, columnar or any particular shape. As used herein, an air gap is a type of void.

As used herein, the maximum distance that two structures can be apart from each other without any features in between them and that allows for a void to be formed between them upon deposition of a material over the two structures is the void spacing. Therefore, if the distance between two metal interconnects is less than or equal to the void spacing, a void will be formed between them when a layer of the material is subsequently deposited. In one embodiment, the void spacing is approximately 0.4 microns, but this will vary depending on the type of material deposited and the process used to deposit it. Conductive interconnects are spaced apart from each other at distances greater than the void spacing to decrease capacitance to a level that cannot be achieved by spacing the conductive interconnects at or less than the void spacing. In accordance with the invention, a void is specially formed between the conductive interconnects to further decrease capacitance between the metal interconnects that are spaced apart a distance greater than the void spacing. These voids are created with the aid of dummy features.

Dummy features, which can be conductive or insulating, are formed between the conductive interconnects so that spacings between the dummy features and the conductive interconnects and the dummy features themselves are less than or equal to the void spacing. Thus, voids are formed between a dummy feature and a conductive interconnect as well as between two dummy features between the conductive interconnects when a layer is subsequently formed. This further decreases the capacitance between the conductive interconnects than by forming air gaps between them.

Figure 1:
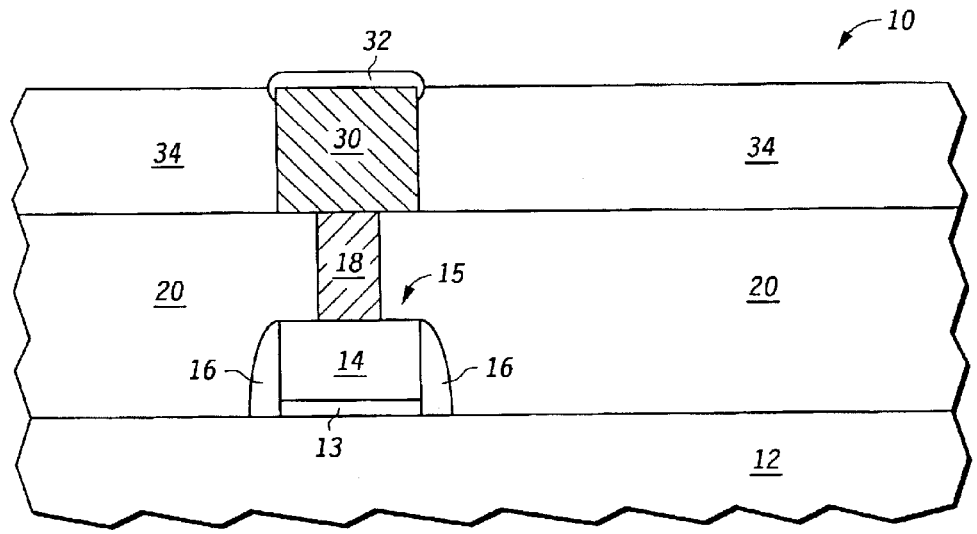
FIG. 1 illustrates a cross-sectional view of a portion of a semiconductor device having a transistor and a first interconnect with a first passivation layer formed over the first interconnect in accordance with an embodiment of the present invention.

Illustrated in FIG. 1 is a portion of a semiconductor device 10 having a transistor 15 formed over a portion of a semiconductor substrate 12. The transistor 15 includes a gate electrode 14 formed over a gate dielectric 13, and sidewall spacers 16 adjacent the gate electrode 14 and the gate dielectric 13. Source and drain regions (not shown) of the transistor are formed in the semiconductor substrate 12 under the sidewall spacers 16. In one embodiment, the gate electrode 14 is polysilicon, the gate dielectric 13 is silicon dioxide, the spacers are silicon nitride, and the semiconductor substrate 12 is monocrystalline silicon. The transistor 15 can be formed with any known materials using any conventional process.

In one embodiment, a first dielectric (insulating) layer 20 (e.g.,. silicon dioxide, or a low-k material) is formed over the transistor 15 by any method, such as chemical vapor deposition (CVD) and spin-on-deposition (SOD), and is patterned to form a contact opening. A conductive material is deposited in the contact opening and over the first dielectric layer 20 by any conventional method, and polished so that the top surface of the conductive material is substantially coplanar with the first dielectric layer 20. The remaining conductive material in the contact opening forms a first current carrying region (or contact) 18. In a preferred embodiment, the first current carrying region 18 is tungsten, copper or a copper alloy; any other conductive material or any combination of conductive materials may be used.

After forming the first current carrying region 18, a second dielectric layer 34 is deposited over the first dielectric layer 20 and the first current carrying region 18. A second current carrying region 30 is formed using similar processes used to form the first current carrying region 18. More specifically, an opening is formed in the second dielectric layer 34 and a conductive material, such as copper or a copper alloy, is deposited over the second dielectric layer 34 and within the opening. In one embodiment, a barrier material such as TaN, Ta, WCN, the like, and combinations of the above are deposited by CVD, physical vapor deposition (PVD), atomic layer deposition (ALD), the like and combinations of the above before forming the conductive material in the opening to serve as a diffusion barrier or a glue layer. A polishing process is formed to make the top surface of the conductive material substantially coplanar with the second dielectric layer 34 resulting in the second current carrying region 30. If the barrier material is present, the polishing process will also remove portions of the barrier material that are not within the opening.

As a skilled artisan should recognize a dual inlaid process could be used to form the first current carrying region 18 and the second current carrying region 30 instead of the single inlaid process previously described. Using the dual inlaid process, the first dielectric layer 20 and the second dielectric layer 34 are deposited as one dielectric layer and openings for the first current carrying region 18 and a second current carrying region 30 are formed using lithography. A conductive material is then deposited over the dielectric layer to fill the opening. The conductive material is polished so that the top surface of the material in the opening, which forms the second current carrying region 30, is substantially coplanar with the top of the one dielectric layer.

Various materials and some processing was described in regards to the above structures, however a skilled artisan understands how to form a transistor over a semiconductor substrate, and the first 18 and second 30 current carrying regions within dielectric layer(s). Thus, any conventional processes and materials can be used for forming the structures discussed above and the invention is not limited to the processes of materials thus far described.

After forming the second current carrying region 30, a first passivation layer 32 is formed over the second current carrying region 30. Portions of the first passivation layer 32 may extend over portions of the second dielectric layer 34, as shown in FIG. 1. If the second current carrying region 30 includes copper, the first passivation layer 32 can be any copper diffusion barrier material, such as Ta, TaN, WCN, CoWP, CoP, NiWP, NiB, CoWB, NiReP, CoReP, Ni, the like and combinations of the above. In other words, the passivation layer 32 is a material that includes copper, nickel, phosphorus, tungsten or Re. If the second current carrying region includes different or additional elements that could undesirably diffuse then the material chosen for the passivation layer 32 should prevent diffusion of the additional or different elements.

In a preferred embodiment, the passivation layer 32 is formed by electroless deposition. Electroless deposition of the first passivation layer 32 involves the use of a solution with reducing agents to drive the reduction of metal ions. The reaction may result in selective deposition of metals on the surface of the second current carrying region 30 depending on the catalytic activity of the surface and the electroless solution. (As described above, portions of the first passivation layer 32 may extend over portions of the second dielectric layer 34. This overlap of the first passivation layer 32 over the second dielectric layer 34 is an artifact of the deposition of the first passivation layer 32 at or near the edge of the second current carrying region 30, so that the passivation layer in effect overlies portions of the second dielectric layer 34 although the second passivation layer 32 is not deposited on the second dielectric layer 34.) If the reaction is catalytic on the desired surfaces of the substrate (such as with CoWB on Cu from a electroless solution including dimethylamine borane as a reducing agent), the application of a separate catalyst is not needed. If the reaction is not catalytic on the surface of the second current carrying region 30 (such as CoWP on Cu from a neutral electroless solution including ammonium hypophosphite as a reducing agent), the surface may be made catalytically active by the application of separate catalyst such as Pd or Pt. The catalyst may be applied to the surface prior to electroless deposition by spraying, immersing, or applying a solution containing the catalyst on the entire surface of the substrate. The catalyst may be selectively deposited on desired surfaces of the substrate if an exchange reaction with the second current carrying region 30 occurs. The exchange reaction occurs when the driving force for reduction of the catalyst (e.g. $Pd^{++}+2e-\rightarrow Pd^0$) is supplied by the oxidation of the second current carrying region 30 (e.g. $Cu^0 \rightarrow Cu^{+2}+2e-$). In this reaction, some of the second current carrying region 30 is oxidized and left with some reduced catalyst. Generally, a minimum surface coverage of a catalyst is needed to initiate the electroless deposition reaction. For example, a $Pd^0$ concentration of $10^{16}$ atoms/cm$^2$ may be needed to initiate deposition of CoWP from a neutral electroless solution containing ammonium hypophosphite as a reducing agent. Any remaining catalyst ions ($Pd^{++}$) that may be adsorbed to portions of the surface that do not participate in the exchange reaction (e.g. $SiO_2$) may be removed by placing the semiconductor substrate in contact with another solution that includes chelating or complexing agents to remove catalyst ions from the surface. In this manner, the reduced catalyst (e.g., Pd0) is left on the second current carrying region 30 and the catalyst ions (e.g., $Pd^{++}$) are removed from the undesired deposition surfaces (e.g. $SiO_2$) and the reaction remains selective to the second current carrying region 30. In either embodiment, (whether catalytic activation is needed or not), the electroless reduction reaction is typically autocatalytic on the surface of the reduced second current carrying region 30. For example, once an initial metal layer of CoWP is deposited, subsequent CoWP deposition is autocatalytic on the CoWP surface.

Figure 2:
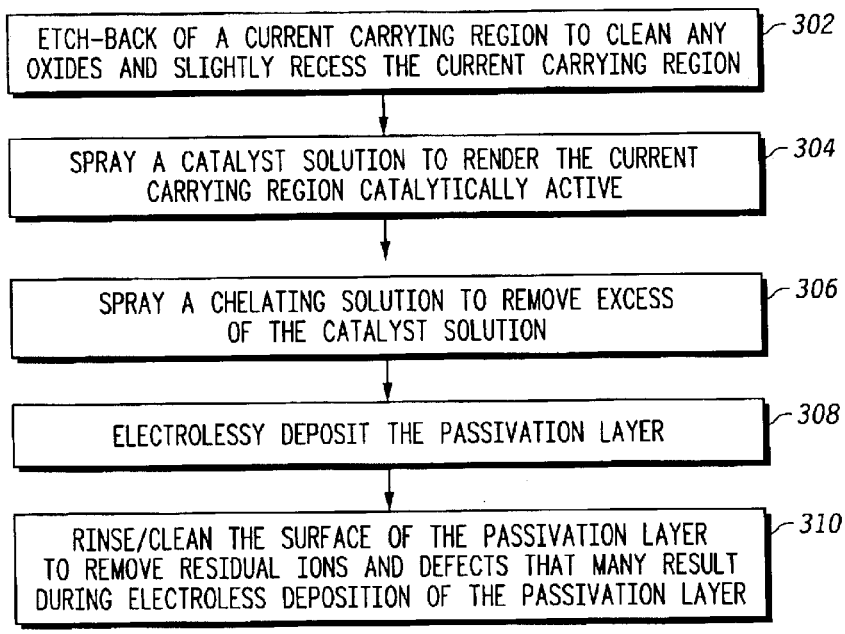
FIG. 2 illustrates an electroless barrier deposition flow used to form the passivation layer in accordance with a preferred embodiment of the present invention.

A general electroless deposition flow 300 for forming the passivation layer 32 is shown in FIG. 2. First, as stated in step 302, an etch-back of the second current carrying region 30 is performed to clean any oxides and recess the second current carrying region 30. Next, a catalyst solution, such as a palladium-based solution (e.g., palladium and water) is sprayed to render the second current carrying region 30 catalytically active, as stated in step 304. To remove excess of the catalyst solution, a chelating solution, such as citrate and tartrate, is sprayed on the second current carrying region 30, as stated in step 306. To form the passivation layer 32, electroless deposition is performed, as stated in step 308.

Electroless deposition occurs by placing the semiconductor substrate in an electrolyte containing metal ions, such as $Co^{++}$, $Ni^{++}$, $WO^{3-}$, or other soluble species of Re, Rd, Pt, Ir, Sn or Cu, or the like, and a reducing agent, such as sodium hypophosphite, ammonium hypophosphite, dimethyamine borane, formaldehyde, absorbic acid, glycolic acid, and the like. The electroless plating process is selective to the conductive material used to form the second current carrying region 30 and allows for the first passivation layer 32 to grow both laterally and vertically. Thus, the first passivation layer 32 extends beyond the width of the second current carrying region 30. In other words, the first passivation layer 32 overhangs the second dielectric layer 34. The isotropic growth of the first passivation layer 32 is self-aligned and defines spacers along the sides of the second current carrying region 30 without requiring additional patterning steps, as will be explained in further detail below. After electrolessly depositing the passivation layer 32, the surface of the passivation layer 32 is rinsed or cleaned with DI (deionized) water to remove residual ions and defects that may arise from the electroless deposition as stated in step 310.

The steps 302, 304, 306, 308, and 310 can be performed in one chamber by using the solutions in sequence with rinses between each step, or in different chambers for each step. In yet another embodiment, some of the steps 302–310 may be combined in one chamber and others performed in different chamber(s). In this embodiment, the semiconductor device 10 is transferred manually or by robot from one chamber to another. In all the embodiments, the different chambers are preferably chambers on the same tool to increase cycle time; the different chambers may be parts of different tools. In addition, there may be cleans or rinses before and after each step. The semiconductor device 10 may be heated prior to any of the steps 302, 304, 306, 308, and 310 and likewise the solutions may be heated. In one embodiment, the electroless CoWP solution is typically maintained at 70–95 degrees Celsius. The step 308 alone of electroless deposition of the passivation layer 32 without performing any of the other steps 302, 304, 306, and 310 results in sufficient formation of the passivation layer 32 if the conductive material of the second current carrying region 30 is catalytically active in the electroless solution.

Alternatively, the first passivation layer 32 can also be formed by chemical vapor deposition (CVD), physical vapor deposition (PVD), atomic layer deposition (ALD), the like, or combinations of the above. Using these methods, the passivation layer 32 is formed over the second current carrying region 30 and the entire second dielectric layer 34, unless a mask or special deposition process is used. The first passivation layer 32 would then be deposited as a conformal layer. If the material used for the first passivation layer 32 has a higher dielectric constant that that of the second dielectric layer 34, it is desirable to pattern the first passivation layer 32 to minimize the amount of material present. This patterning step would undesirably increase manufacturing complexity, cycle time, and cost.

After forming the first passivation layer 32, in one embodiment, an etch stop layer (not shown) is optionally formed over the first passivation layer 32 and the third dielectric layer 34. The etch stop layer may be silicon carbide, an organic material, or any other material that has an etch rate that is different from a fourth dielectric layer 36 (an interlevel dielectric) that will subsequently be formed on the etch stop layer formed by CVD, PVD, SOD (spin on dielectric), the like and combinations of the above.

After forming the first passivation layer 32 and the optional etch stop layer, the fourth dielectric layer 36 is formed over the semiconductor substrate and patterned using conventional processing to form conductive dummy feature openings and an interconnect opening over the second current carrying region 30. In addition, the first passivation layer 32 is patterned so that the interconnect opening exposes a portion of the second current carrying region 30. Exposing the second current carrying region is desirable because it reduces via resistance but is not necessary if the first passivation layer 32 is conductive (e.g., CoWP). If the passivation layer 32 is CoWP the passivation is selectively deposited on the second current carrying region 30.

Figure 3:
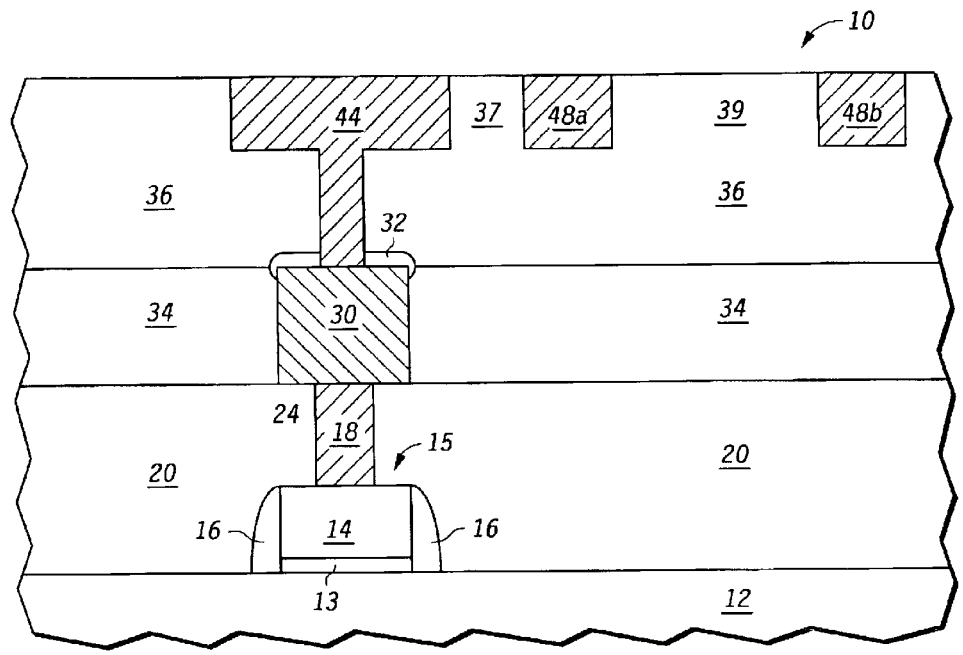
FIG. 3 illustrates the semiconductor device of FIG. 1 after forming a second interconnect and conductive dummy features.

Subsequently, a conductive material is deposited using CVD, PVD, ALD, the like or combinations of the above within the interconnect opening and the conductive dummy feature openings so as to fill them and deposit over the fourth dielectric layer 36. In one embodiment, a chemical mechanical (CMP) process is performed to remove excess conductive material (i.e., conductive material that is not within the interconnect opening and the conductive dummy feature openings) to form a current carrying region 44, which is electrically coupled to the second current carrying region 30, a first conductive dummy feature 48a and a second conductive dummy feature 48b, as shown in FIG. 3. In another embodiment, an etchback process can be used to remove the excess conductive material. In the embodiment shown, the first conductive dummy feature 48a is separated from the current carrying region 44 by a first insulating region 37, which has a width less than or equal to the void spacing, and the second conductive dummy feature 48b is spaced apart from the first conductive dummy feature 48a by a second insulating region 39 that has a width greater than the void spacing.

Figure 4:
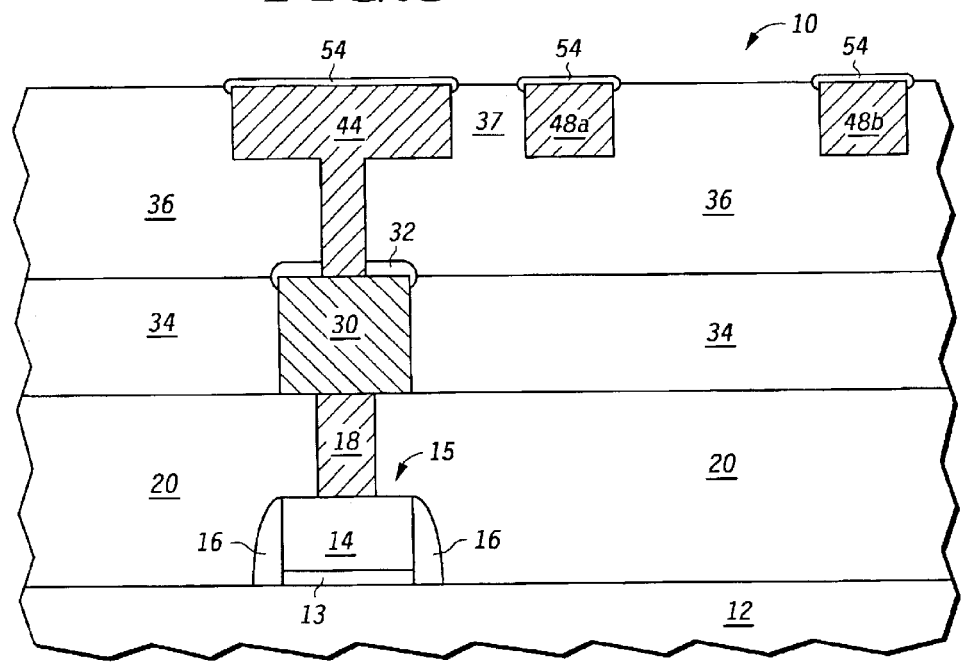
FIG. 4 illustrates the semiconductor device of FIG. 2 after forming second passivation layers over the second interconnect and the conductive dummy features.

Second passivation layers (caps) 54 are formed over the current carrying region 44, the first conductive dummy feature 48a and the second conductive dummy feature 48b, as shown in FIG. 4. Preferably, the second passivation layers 54 are formed using electroless deposition as described with respect to forming the first passivation layer 32, thereby resulting in the second passivation layers 54 extending beyond the current carrying region 44 and each of the conductive dummy features 48a and 48b, thereby overhanging the fourth dielectric layer 36. The same materials and processing flow can be utilized; it is not necessary that the first passivation layer 32 and the second passivation layers 54 be formed using the same materials or identical processes. Alternatively, any other method described for forming the first passivation layer 32 can be used.

Figure 5:
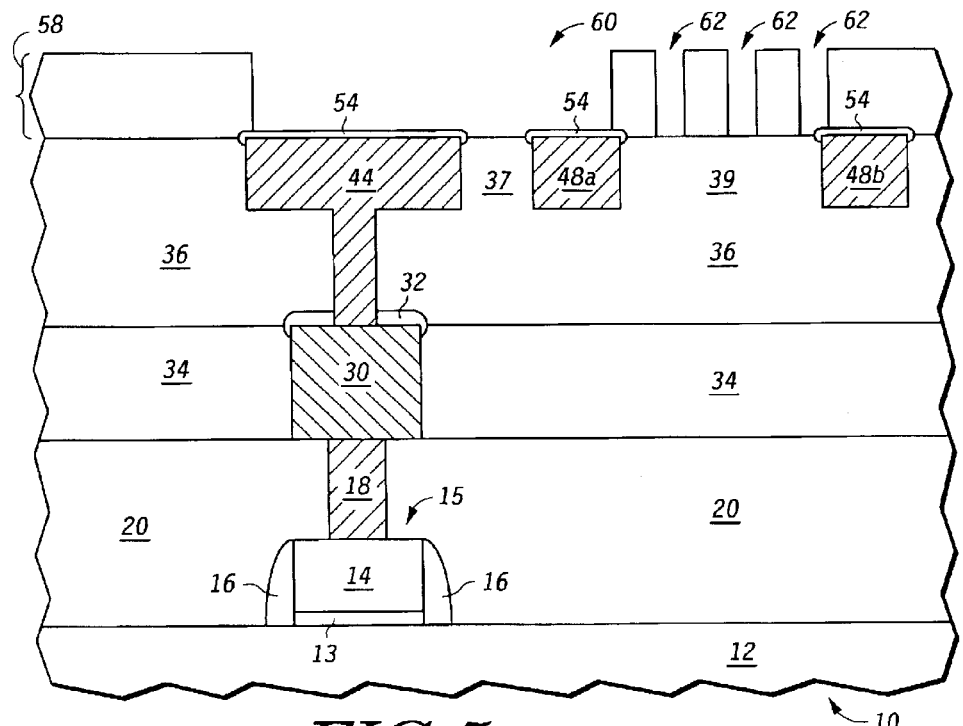
FIG. 5 illustrates the semiconductor device of FIG. 4 after forming a patterned photoresist layer.

As shown in FIG. 5, a (photo)resist layer 58 is deposited over the semiconductor device 10 and patterned to form a first opening 60 which exposes the first insulating region 37 and the second passivation layers 54 formed over the current carrying region 44 and the first conductive dummy feature 48a. Additionally, the photoresist layer 58 is patterned to form multiple dummy openings 62 over the second insulating region 39 and a portion of the second conductive dummy feature 48b. As will be explained in more detail below, the first insulating region 37 between the current carrying region 44 and the first conductive dummy feature 48a are subsequently etched without damaging or etching the current carrying region 44 or the first conductive dummy feature 48a due to the presence of the second passivation layer 54. Therefore, the width of the first opening 60 can vary and be as small as the width of the insulating region 37 or extend over the current carrying region 44 and the first conductive dummy feature 48a. In other words, the first opening 60 exposes any portions of the fourth dielectric layer 36 to be etched and portions of the third passivation layers 54. Thus, the first opening 60 can be wider than the area that will subsequently be etched (i.e., the first insulating region 37).

Since small widths are often difficult to pattern, the ability to increase the width of the first opening 60 without damaging the current carrying region 44 or the first conductive dummy feature 48a is desirable. In regards to the dummy openings 62, they too can extend over conductive areas, because the second passivation layers 54 serve to protect the conductive dummy features 48a and 48b and the current carrying region 44 (i.e., all conductive areas) while etching. Any resist material or lithographic process may be used to form the first opening 60 and the dummy openings 62.

Figure 6:
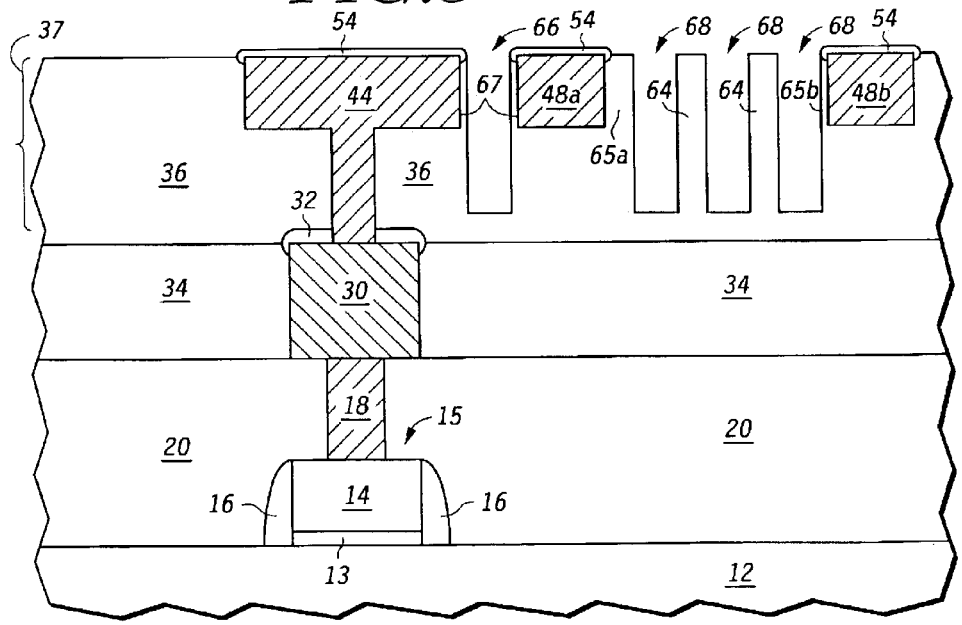
FIG. 6 illustrates the semiconductor device of FIG. 5 after forming insulating dummy features.

The fourth dielectric layer 36 is etched using the photoresist layer 58 as a mask and a fluorine containing etchart chemistry to form oxide dummy spacings 68, which are between first insulating dummy features 64 and second insulating dummy features 65, and conductive dummy spacing 66, which is adjacent the first conductive dummy feature 48a in one embodiment as shown in FIG. 6. The conductive dummy spacing 66 is between and adjacent the current carrying region 44 and first conductive dummy feature 48a. In another embodiment, the conductive dummy spacing 66 is between two conductive dummy features. In one embodiment, the width of the dummy spacings 68 and 66 are less than or equal to approximately the void spacing. After forming the dummy spacings 68 and 66, the photoresist layer 58 is removed using a conventional ash process (an etch performed in an oxygen environment).

The first insulating dummy features 64 are formed because of the presence of the insulating dummy spacings 68 and, as will be better understood after the discussion below, are formed as part of a process to form air gaps. The second insulating dummy features 65a and 65b are the portions of the fourth dielectric layer 36 that are adjacent and in physical contact with the first and second conductive dummy features 48a and 48b in the embodiment shown in FIG. 6, but can be in physical contact with interconnects or conductive dummy features. The second insulating dummy features 65a and 65b are formed in one embodiment to insulate the first and second conductive dummy features 48a and 48b, and therefore are not required in all embodiments. As shown in FIG. 6, the second insulating dummy feature 65a horizontally extends beyond the second passivation layer 54, while the second insulating dummy feature 65b (and third insulating dummy features 67) have widths that are approximately equal to the amount of overhang of the passivation layer 54. Each of the insulating dummy features do not have to have the same widths as each other, especially if they are located in different areas of the semiconductor device 10 that have different capacitance sensitivities or requirements. Due to the overhang of the passivation layer 54, a portion of the fourth dielectric layer 36 remains adjacent the conductive regions 44, 48a and 48b to form the second insulating dummy feature 65b and the third insulating dummy features 67, which protect the current carrying region 44, 48a or 48b. Since the second passivation layer 54, as discussed above, is not removed when etching the fourth dielectric layer 36, the mask pattern and photoresist pattern used to etch the fourth dielectric layer 36, can have openings that expose the passivation layer 54. Therefore, the tolerance of the openings of the mask pattern and photoresist pattern are not critical, making processing easier.

An insulating material 72 is formed over the semiconductor substrate 12 to form air gaps 74 in the dummy spacings, as shown in FIG. 7. The insulating material is a non-gap filling material and can be an organic or non-organic material, such as silicon dioxide formed using TEOS, fluorine-doped silicon dioxide formed using fluorinated-TEOS (FTEOS), organic spin-on glass, the like or combinations of the above, formed by CVD, high density plasma (HDP), spin-on, the like, and combinations of the above. The parameters that determine if a material is non-gap filling depends on the method used to deposit the material and the width and depth of the (insulating and conductive) dummy spacings 66 and 68 in which the air gaps 74 are formed. For example, if CVD is used, the step coverage of the material determines whether the material will form an air gap in a particular dummy spacing. For example, a more conformal material, will make smaller air gaps or tend not to form air gaps at all. For spin-on materials, viscosity and surface properties affect the formation of an air gap. Surface energy interactions between materials may also impact air gap formation, especially for materials that are spun-on. In one embodiment, the height of the insulating material 72 is at least half the width of the largest width of the dummy spacings 66 and 68 so that the air gaps 74 pinch off and are completely established when forming the insulating material 72. Another insulating material that is the same or different can be deposited over the insulating material 72 to form a thicker dielectric layer over the current carrying region 44, the first 48a and second 48bconductive dummy features, and the air gaps 74, if desired. In one embodiment, the width of the air gaps 74 is less than or equal to approximately the void spacing.

In order to form the air gaps 74, the width of the dummy spacings 66 and 68 also need to be chosen appropriately. If the width of the dummy spacings 66, 68a and 68b are too large, then the non-gap filling material may actually fill them. Thus, whether a void is formed depends on both the width of the dummy spacings 66, 68a and 68b and the material properties of the insulating material 72. In one embodiment, TEOS is deposited by CVD to form voids 74 in dummy spacings 66 and 68 that are approximately 0.4 microns in width.

In the embodiment illustrated in FIG. 7, the air gaps 74 are formed only within the fourth dielectric layer 36 and, therefore, do not extend to or past the bottom surface of the fourth dielectric layer 36. In other words, the air gaps 74 are formed within one interconnect layer. In an alternate embodiment, shown in FIG. 8, air gaps 106 extend through a third dielectric layer (ILD) 104 and a second dielectric layer 94 and into a first dielectric layer 89. Thus, the air gaps 106 are formed within a plurality of interconnect layers. The air gap 105 in FIG. 8 is similar to the air gaps 74 in FIG. 7 because it extends through one interconnect level. The air gap 105 also stops on a passivation layer 96 formed over a second current carrying region 92.

Semiconductor device 80 shown in FIG. 8 differs from the semiconductor device 10 shown in FIG. 7 in two main ways: 1) a first transistor 85 and a second transistor 87 are present in FIG. 8 (as opposed to just one transistor as shown in FIGS. 7) and 2) the air gap 105 and 106 extend beyond the third dielectric layer 36 in FIG. 8 (i.e., the air gap 105 and 106 are present in multilayers of the semiconductor device 80). The first transistor 85 formed over a semiconductor substrate 81 has a first gate dielectric 83, a first gate electrode 84 and first sidewall spacers 86. The second transistor 87 has a second gate dielectric, a second gate electrode 107 and second sidewall spacers 91. Source and drain regions (not shown) for both the first and second transistors 85 and 87 are present in the semiconductor substrate 81, under the first sidewall spacers 86 and the second sidewall spacers 91, respectively.

A first contact 88 couples the first transistor 85 to the first current carrying region 90 and a second contact 93 couples the second transistor 87 to the second current carrying region 92. A first passivation layer (cap) 96 is preferably formed by electroless plating over the first and second current carrying regions 88 and 92, but can be formed by any other means discussed above for the passivation layers formed in FIGS. 1 and 3–7.

A third current carrying region 98, similar to the current carrying region 44 in FIG. 7, is electrically coupled to the first current carrying region 88 and the conductive dummy features 100 are similar to the conductive dummy features 48a and 48b of FIG. 7. A second passivation layer 102 similar to the first passivation layer 96 in the embodiment shown in FIG. 7 is formed over the third current carrying region 98 and the conductive dummy features 100. The processes and materials used to the elements of the semiconductor device 80 in FIG. 8 can be those previously discussed for equivalent elements of the semiconductor device 10 in FIGS. 1 and 3–7.

The air gap 105 stops on the first passivation layer 96 formed over the second current carrying region 92. Because the first passivation layer 96 is present, the second current carrying region 92 is not damaged or etched and hence, is protected. In contrast, the air gaps 106 extend through the third dielectric layer 104 (i.e., a first interconnect level) and the second dielectric layer 94 (i.e., a second interconnect level) into the first dielectric layer 89 (i.e., a third interconnect level) since no conductive features are present below the air gaps 106 to impede them. In other words, the air gaps 106 are present in a plurality of interconnect levels.

Two types of dummy features are described above: conductive dummy features and insulating dummy features. The conductive dummy features are formed when forming interconnects (trenches and/or vias), although conductive they do not transmit a current because they are not coupled to transistors or other electrical devices. The insulating dummy features are formed in the third dielectric layer 36 or 104, which is the same dielectric layer the conductive dummy features and the interconnects are formed within. However, the insulating dummy features are formed after the interconnect and the conductive dummy features (if present) are formed in the third dielectric layer 34 or 104. An dielectric layer 72 or 108 is then deposited over the insulating dummy features to form voids within dummy spacings.

The insulating and conductive dummy features 64, 48a and 48b can be support structures for subsequently deposited layers. In one embodiment, the insulating material 72 can be an insulating membrane layer. The insulating membrane layer may be deposited or placed over the dummy features 64, 48a and 48b and current carrying region 44, thereby forming air gaps in the dummy spacings. Since there is no risk of the membrane filling the dummy features, in this embodiment there is no width constraint on the dummy spacings. In other words, a dummy spacing, in theory, can be infinitely wide. By placing a membrane over the infinitely wide dummy spacing an air gap is created. Thus, the dummy spacings do not need widths that are equal to or less than the void spacings in order for voids to be formed within them. In this embodiment, the dummy spacings are also support structures for the membrane.

Although both conductive dummy features and insulating dummy features are described together, it is not necessary to use both type of dummy features within the same semiconductor device. Instead, either conductive dummy features or insulating dummy features may be used to form air gaps adjacent interconnects and other conductive features that are sensitive to capacitance, as desired. In addition, it is not necessary that insulating dummy features be adjacent each other or conductive dummy features. An insulating dummy feature could be used in place of the first conductive dummy features 48a in FIG. 7. In other words, an insulating dummy feature can be adjacent to and form an air gap between itself and an interconnect or any other feature. Furthermore, the dummy features can be used in any level of processing where voids are desirable, not just the metal level shown and described in regards to the figures.

Figure 9:
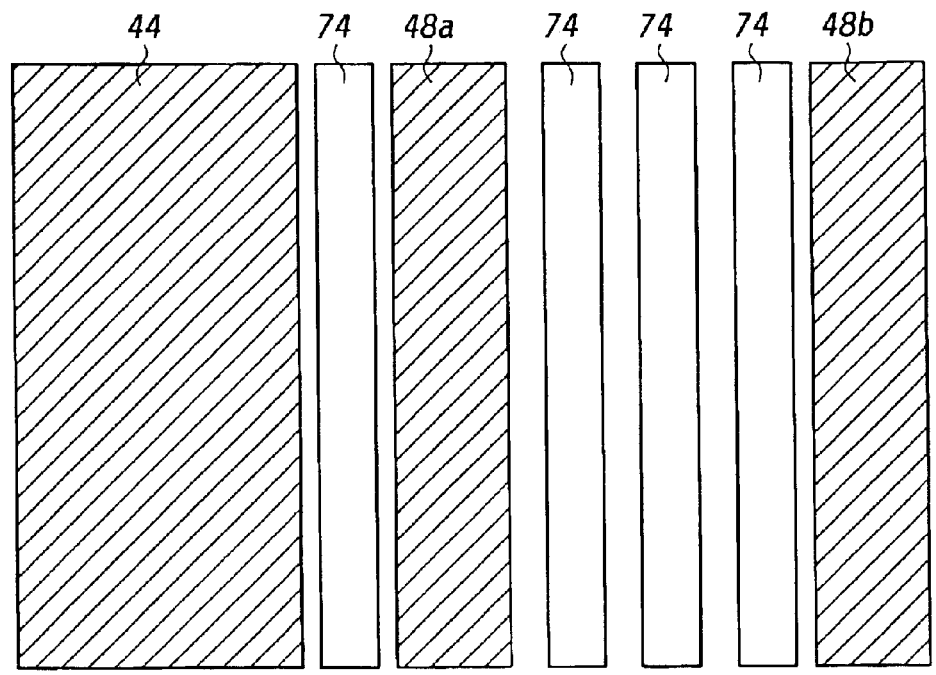
FIG. 9 illustrates a top view of the voids in FIGS. 7 and 8.

A skilled artisan should recognize that from a top view of a semiconductor wafer, the air gaps can be continuous lines and look like a maze, closed loops, or may be any other patterns or shapes. Shown in FIG. 9 is a cross-section of the semiconductor device 10 shown at the location indicated by the line in FIG. 7. Thus, FIG. 9 is a top view of the air gaps 74 and the conductive regions 44, 48a and 48b formed in FIGS. 1 and 3–7 without showing the second passivation layer 54 and the insulating material 72 so that the pattern of the air gaps and conductive regions 44, 48a and 48b can be clearly seen. In the embodiment shown in FIG. 9, the air gaps 74 are parallel to and are about the length as the adjacent conductive regions 44, 48a and 48b. Alternatively, the air gaps 74 or the conductive regions 44, 48a and 48b may have dimensions different than that shown in FIG. 9. For example, the length of any of air gaps 74 or the adjacent conductive regions 44, 48a and 48b may be longer than illustrated. It is not necessary that the air gaps 74 have the same length or width as the conductive regions 44, 48a and 48b. Thus, in one embodiment the air gaps 74 from a top view have a length that is less than or greater than that of at least one or all or the conductive regions 44, 48a and 48b. Likewise, the conductive dummy features 48 and 48b may have lengths different than that of the current carrying region 44 or the air gaps 74.

Figure 10:
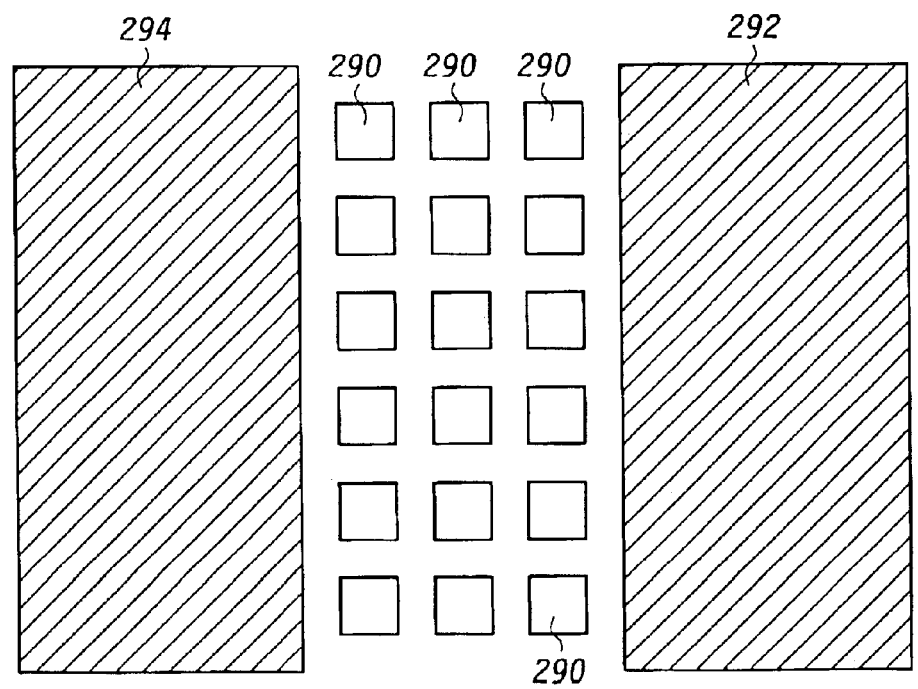
FIG. 10 illustrates a top view of another embodiment of voids in accordance with the present invention.

In another embodiment shown in FIG. 10, air gaps 290, which are formed by the same methods used to form the air gaps, are a pattern or array of predetermined shapes, such as squares or rectangles, a predetermined number of rows and a predetermined number of columns. The air gaps 290 are between a first conductive region 294, which can be an interconnect or a conductive dummy feature, and a second conductive region 292, which can be the same or different feature as the first conductive region 294. In addition, if the first conductive region 294 or the second current carrying region 292 are conductive dummy features, they could also be a repetitive pattern of a predetermined shape, such as rectangles or squares. Thus, in one embodiment the air gaps 290 have a length that is substantially less than that of a conductive region (an interconnect or a conductive dummy feature), and in another embodiment, the air gaps 290 and conductive dummy features are the same length, which is less than that of the interconnect. In another embodiment, the air gaps are larger than the conductive region to reduce fringing field effects. Using a number of smaller dummy features rather than one or a few large dummy feature leaves some of the dielectric layer between the dummy features, which provides for increased mechanical support for subsequent polish processes and packaging.

Figure 11:
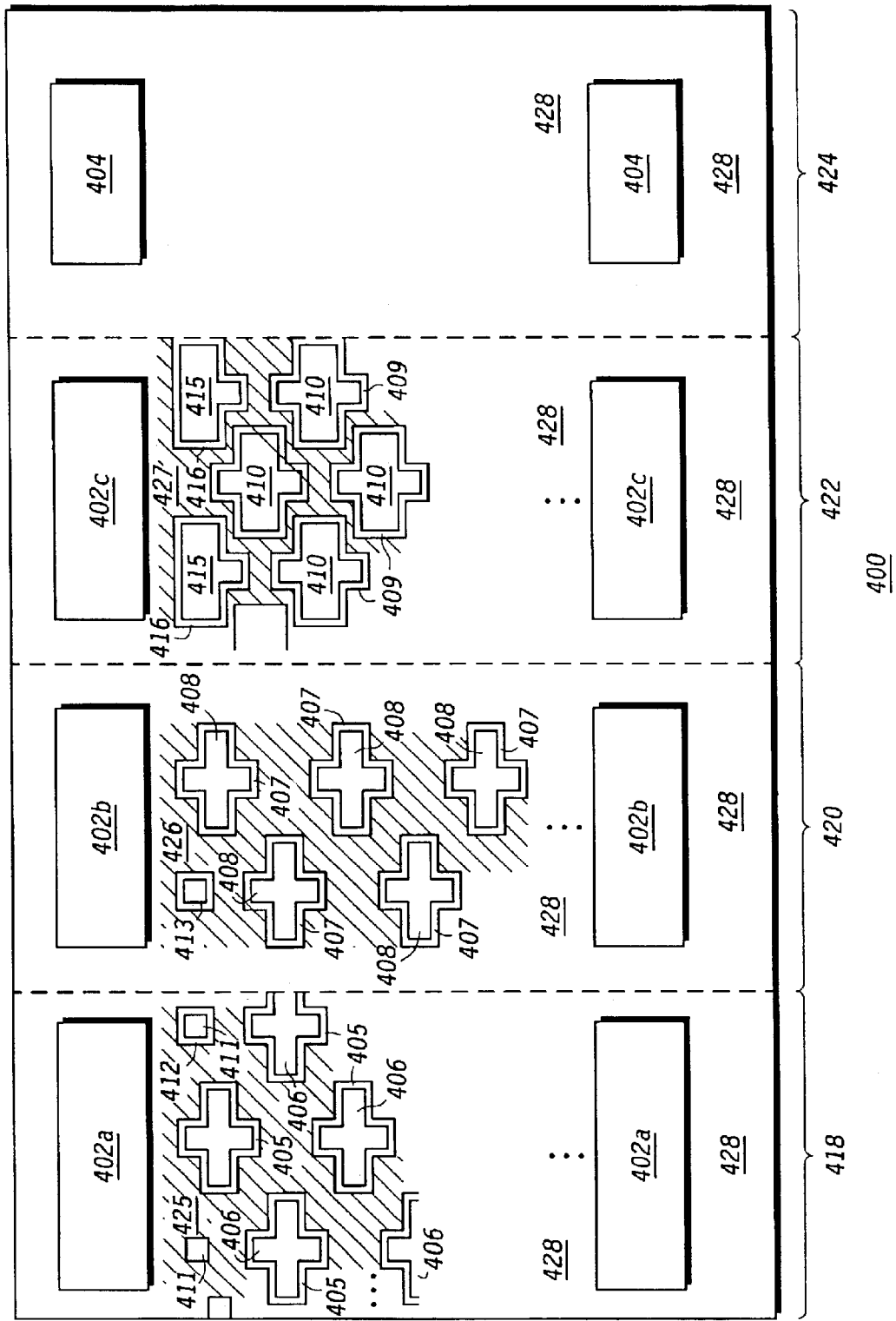
FIG. 11 illustrates a top view of a portion of a semiconductor die with regions having different dummy features parameters in accordance with one embodiment of the present invention.

Shown in FIG. 11 is a portion of a semiconductor die 400 having a first region 418, a second region 420, and a third region 422 that each have different layouts of dummy features based upon desirable parameters and a fourth region 424 that does not include any dummy features. Each region 418, 420, 422 and 424 includes a dielectric layer 428. Although the dielectric material 428 is shown to be the same in all regions, the dielectric material in each region may be different if desired.

In the embodiment shown in FIG. 11, dummy features 406, 408, and 410 are conductive dummy features surrounded by insulating regions 405, 407, and 409, respectively. In another embodiment, the dummy features 406, 408 and 410 are insulating dummy features and in this embodiment may not be surrounded by insulating regions 405, 407 and 409, respectively. However, it is not necessary that all the dummy features on the same semiconductor die 400 or within the same region be the same. In other words, the dummy features 406, 408 and 410 can be any combination of oxide or conductive dummy features.

The first region 418 also includes critical circuitry 402a which can be clock distribution circuitry, long signal lines, long parallel data lines, transmission lines, the like, and combinations thereof. It is desirable to control the capacitance coupling between critical circuitry, which is a current carrying feature or group of current carrying features, and another feature or group of features, which may or may not be critical circuitry. The critical circuitry and the other features or group of features between which capacitance coupling is controlled can be in different or same planes as, adjacent to or diagonal from each other. The first region 418 also includes abutted dummy features 411 that are located adjacent critical circuitry 402a. Due to the proximity of the abutting dummy features to the critical circuitry 402a, the entire dummy features 406 could not be formed and instead only a portion of the entire dummy features 406, thereby resulting in the abutting dummy features 411.

The second region 420 and the third region 422 include second critical circuitry 402b and third critical circuitry 402c, respectively. The critical circuitry 402a, 402b, and 402c are all different from each other in that they have different capacitance requirement. In the first region 418, dummy features 406 are formed having a first shape, density, size, spacing, and pattern. The shape, size, density, spacing and pattern and material chosen for the dummy features 406 is determined based on desired capacitance coupling between the first critical circuitry 402a. The second region 412 and the third region 413 have dummy features 408 and 410, respectively, that are different in shape, size, density, spacing and pattern in each region and are different than the dummy features 406 due to the different capacitance coupling requirements between the critical circuitry 402a–c. The first region 418 and the second region 420 differ from each other in that the dummy features 406 and 408 have different spacings between them and the critical circuitry 402a–b. This results in different capacitance coupling between the critical circuitry 402a–b due to a different effective dielectric constant. The different effective dielectric constant is due to the different area of air gaps shown as shaded regions 425–426 being formed between the dummy features 406 and 408 themselves and the critical circuitry 402a–b. Since 402a–b are critical circuitry it is desirable to minimize the coupling between them and therefore to form air gaps between the dummy features 406 themselves and between the dummy features 406 and the critical circuitry 402. Thus, the spacings between the dummy features 406 and 408 themselves and between the dummy features 406 and 408 and the critical circuitry 402a–b, although greater than the spacings between the similar features in other regions of the semiconductor die 400, are small enough so that air gaps are formed within them. Since the area of air gaps is greater in the first region 418 than in the second region 420, the capacitance coupling is lesser in the first region 418 (assuming the dummy features 406 and 408 are the same materials.) Since the capacitance coupling may actually increase if dummy features are conductive as compared to insulative, the material chosen for the dummy features 406 and 408 may affect capacitance coupling. This occurs because device performance makes it desirable to minimize capacitance coupling in the first region 418 more than in second region 420.

The dummy feature patterns in the second region 420 and the third region 422 have the same spacing as each other but differ in the size of the dummy features 408 and 410. As shown in FIG. 11, the dummy features 410 are larger than the dummy features 408 because the width of a portion of the dummy features 410 is greater than that of the dummy features 408 thereby altering the mechanical stability and capacitance coupling between the critical circuitry 402b and 402c. As shown in FIG. 11 the capacitance coupling between the third region 422 is greater than that in the second region 420 (provided the dummy features 410 and 406 are the same materials) due to less area within which air gaps 426 and 427 can be formed. This different in capacitance coupling is driven by device performance. In addition, since the area of all the dummy features 410 in the third region 414 is greater than that in the second region 412, the third region has greater mechanical stability than the second region 412 regardless of what material is used for the dummy features 408 and 410.

The fourth region 424 includes noncritical current carrying features 404. Noncritical current carrying features 404 may be bond pads, scribe grids, any metrology features, decoupling capacitors, and the like. (A noncritical current carrying feature is any feature or group of features that are not critical circuitry.) The fourth region 424 may have a greater mechanical stability than the first, second and third regions 418, 420 and 422 since the there are no air gaps present depending on the dielectric material 428 and dummy feature materials chosen. (If conductive features are used, areas with dummy features may have greater mechanical stability due to the Young's modulus of metals, such as copper, generally being greater than that of a mesoporous SOD materials with dielectric constants less than 2.0, which can be used for the dielectric material 425.) Due to the lack of air gaps, the fourth region 424 can also have the greatest capacitance coupling between the noncritical current carrying features 404 if the dummy features in the other regions are oxide dummy features. Generally, noncritical current carrying features 404 will not have air gaps formed between them.

Although the two critical areas illustrated in each of the four region in FIG. 11 are the same as each other, it is not necessary. For example, one area in the first region 418 can be critical circuitry and the other can be noncritical current carrying features. In this embodiment, abutting dummy features may only be adjacent the critical circuitry. The air gaps may not be desirable in the noncritical current carrying regions because capacitance coupling does not require such. Therefore, mechanical stability can be increased. In one embodiment, all four regions exist on the same semiconductor die 400. In another embodiment, any combination of the regions exist on the same semiconductor die. Similarly, it is possible that any or all of the fours regions shown in FIG. 11 exist on the same semiconductor die with the portions of a semiconductor die that are illustrated in FIG. 9 or 10. As previously explained, the dummy features do not all have to be the same shape on the semiconductor die.

The shape of the dummy features shown in FIG. 11 are better at decreasing crack propagation through the semiconductor dice during sawing or singulating the semiconductor die in order to package it as compared to those illustrated in FIGS. 9–10. It is more difficult for a crack to travel through the dielectric material 428 and the air gaps 425–427 because there is less of a direct line between the dummy features 406, 408 and 410. (Cracks generally propagate in only one axis and stop when they encounter a large enough obstacle.) Since the spacing between the dummy features is greater in the first region 418 it is possible that cracks may more easily travel or propagate farther in this region than in the second region 420 or the third region 422. However, since there are no dummy features in the fourth region 424, cracks may propagate most easily and farther in this region than any other region in the portion of the semiconductor die 400 shown in FIG. 11.

Any combination of air gaps having different shapes from a topographical view can be used. For example, in one area of a semiconductor wafer, it may be desirable to form the air gaps as squares and in another section as lines of various lengths or all having equal lengths, depending on the space limitations of the layout and the sensitivity of the lines to capacitance. The larger the area in the layout that is available for air gaps to be formed within, the larger the size of the air gaps should be or the greater the number of air gaps present if the air gaps are desirable for circuit performance. Furthermore, the more sensitive a current carrying region is to capacitance, the larger the volume of space adjacent the current carrying region should be taken up by air gaps to minimize the overall dielectric constant of the dielectric layer, which decreases due to the presence of the air gaps.

Figure 12:
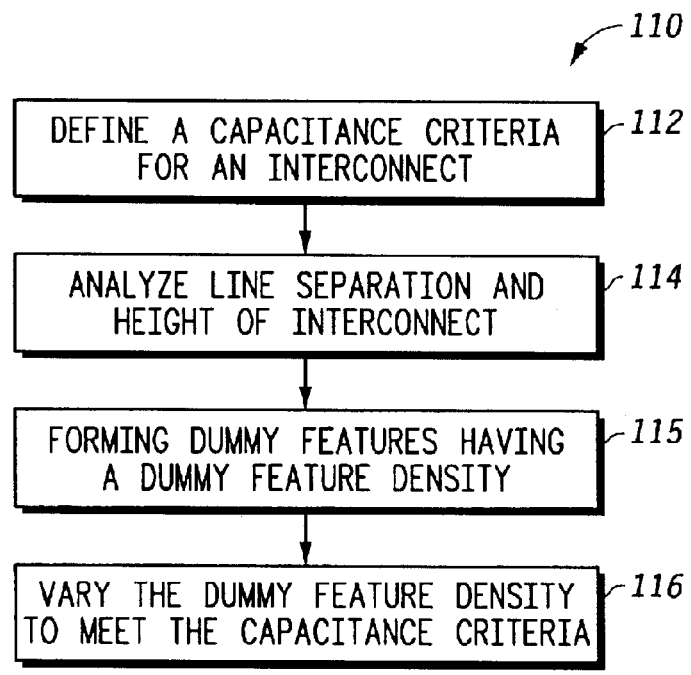
FIG. 12 illustrates in flow chart form a computer automated design (CAD) tool method for providing dummy features for air gap formation in accordance with an embodiment of the present invention.

Illustrated in FIG. 12 is a method 110 for providing dummy features in a layout. In one form, method 110 may be implemented in software as a design automation tool for the purpose of implementing a circuit physical layout. The tool functions by using certain criteria to calculate a dummy feature density in an interconnect level for a given capacitance criteria at predetermined points along a current carrying region. In a step 112, a user defines capacitance criteria for the interconnect. Various criteria and combinations or rankings of criteria may be used. For example, conventional circuit designs use two inverters as drivers at predetermined points along an expanse of an interconnect. The area or size of the inverters may be included in the criteria as well as the width of the conductor size. Additionally, the size and nature (resistive, reactive, etc.) of a load that is connected to the interconnect is a relevant criteria. Design rules, noise levels and maximum conductor delay are other parameters that may be relevant criteria for step 112. In other words, the capacitance criteria may include at least a power requirement, an area requirement, a noise requirement, or a speed requirement.

In a step 114, an analysis is performed to determine the effect of an interconnect spacing between current carrying regions. For example, for a specific set of criteria such as power consumption or interconnect dominated RC delays, capacitance at predetermined points along the interconnect are calculated. The step 114 of analyzing may include calculating resistance and capacitance. In a step 115, dummy features having a dummy feature density are formed in the interconnect level. The dummy features can be conductive dummy features, insulating dummy features, or a combination of the above. In step 116, the density of the dummy features is varied to meet the defined capacitance criteria for the interconnect that was provided in step 112. Reiterative calculations of various dummy features densities may be used until a predetermined acceptable capacitance threshold value is obtained. The method 110 may be automated in a design tool to determine optimum dummy feature density of only predetermined groups in a circuit design or may be automated for every current carrying region used in a design. Additional criteria, such as proximity to noisy or radiating conductors, may be factored into the analysis and may determine what type of dummy features (i.e., oxide or conductive) are used. For example, to decrease noise an oxide dummy feature is desirable over a conductive dummy feature. In this manner, an efficient and automatic calculation of dummy feature density of an interconnect layer may be made quickly.

By now it should be appreciated that there has been provided a method for forming air gaps in interconnect layers. In other words, air gaps can be formed between two current carrying lines that are separated from each other for a distance that is greater than the air gap spacing. The air gaps may be low-k gaps the decrease the dielectric constant of an interlayer or interlevel dielectric layer. Due to the presence of a passivation layers over the interconnects or any conductive regions, the air gaps can optionally extend to the passivation layer or other current carrying regions without damaging the conductive region. Although an extra photolithographic process is necessary to form the insulating dummy features, the conductive dummy features can be formed by altering the mask pattern for forming current carrying regions. Thus, the number of critical photolithographic steps required for manufacturing is not increased. An additional benefit is the relaxation of mask tolerance for the formation of dummy features due to the presence of the passivation layers.

Due to the presence of the passivation layers, the widths of the dummy spacings can vary more than without the passivation layers present since the passivation layers extend beyond the current carrying regions and protect all materials below them. In addition, the passivation layers allows for a increased misalignment tolerance for any vias that may be formed in a dielectric layer over a dielectric layer having air gaps because the passivation layer has a width greater than the metal interconnect. This increased tolerance of the mask decreases mask manufacturing costs since less stringent processing is required to make the mask.

In the foregoing specfication, the invention has been described with reference to specific embodiments. However, one of ordinary skill in the art appreciates that various modifications and changes,can be made without departing from the scope of the present invention as set forth in the claims below. For example, any conventional process can be used to form the interconnects (including contacts), such as a via first, trench last (VFTL) dual-inlaid approach, a trench first, via last (TFVL) dual inlaid approach, or a single inlaid approach. Furthermore, a self-aligned dual hardmask integration or self-aligned etch stop integration can be used to so that a via is patterned only in areas where the hardmask or etch stop has been removed or opened. In addition, the first current carrying region 18 can be formed using a dual inlaid approach and not just a single inlaid process, as shown in the figures. Hence, the processes used to form vias, trenches, contacts and other interconnects above is not limited to that described, as a skilled artisan should recognize. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:

providing a semiconductor substrate;

forming a first dielectric layer over the semiconductor substrate;

forming a current carrying region within the first dielectric layer;

forming a plurality of conductive dummy features within the first dielectric layer, wherein the plurality of conductive dummy features are spaced apart from each other by dummy spacings;

forming a non-gap filling layer over the current carrying region and the plurality of conductive dummy features;

forming voids within the dummy spacings; and forming a second dielectric layer under the first dielectric layer wherein at least one of the voids extends into the second dielectric layer.

2. The method of claim 1, wherein forming the non-gap filling layer is formed concurrently with forming voids within the dummy spacings.

3. The method of claim 1, wherein forming the plurality of conductive dummy features is performed concurrently with forming the current carrying region.

4. The method of claim 1 wherein the plurality of conductive dummy features form an array having a predetermined number of rows and columns.

5. A method for forming a semiconductor device comprising:

forming a semiconductor substrate;

forming a first dielectric layer over the semiconductor substrate;

forming a conductive dummy feature within the first dielectric layer;

forming a insulating dummy feature within the first dielectric layer and adjacent to the conductive dummy feature;

forming a void between the conductive dummy feature and the insulating dummy feature in the first dielectric layer.

6. The method of claim 5, wherein the void is an air gap.

7. The method of claim 5, wherein the insulating dummy feature is formed after the conductive dummy feature.

8. The method of claim 5 further comprising forming a dielectric layer over the conductive dummy feature and the insulating dummy feature while forming the void.

9. A method of providing dummy features, comprising:

defining a capacitance criteria for an interconnect;

analyzing line separation and height of the interconnect;

forming dummy features having a dummy feature density; and varying the dummy feature density to meet the capacitance criteria.

10. The method of claim 9 wherein:

the capacitance criteria includes at least one of a power requirement, an area requirement, a noise requirement or a speed requirement; and analyzing includes calculating resistance and capacitance.

11. A method for forming a semiconductor device comprising:

providing a semiconductor device of having a first region and a second region;

forming first circuitry and first dummy features in the first region, wherein the first circuitry has a first capacitance coupling value;

forming second circuitry in the second region, wherein the second circuitry has a second capacitance coupling value; and adjusting the first capacitance coupling value to a third capacitance coupling value by forming first voids between the first dummy features, wherein the third capacitance coupling value is less than the first capacitance coupling value and different than the second capacitance coupling value.

* * * * *